(12) United States Patent
Reinmuth

(10) Patent No.: US 10,807,860 B2
(45) Date of Patent: Oct. 20, 2020

(54) MICROMECHANICAL COMPONENT FOR A PRESSURE SENSOR DEVICE

(71) Applicant: Robert Bosch GmbH, Stuttgart (DE)

(72) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 167 days.

(21) Appl. No.: 16/309,181

(22) PCT Filed: May 17, 2017

(86) PCT No.: PCT/EP2017/061822
§ 371 (c)(1),
(2) Date: Dec. 12, 2018

(87) PCT Pub. No.: WO2017/215871
PCT Pub. Date: Dec. 21, 2017

(65) Prior Publication Data
US 2019/0185316 A1    Jun. 20, 2019

(30) Foreign Application Priority Data
Jun. 14, 2016   (DE) .......................... 10 2016 210 479

(51) Int. Cl.
*B81B 3/00*        (2006.01)
*G01L 9/00*        (2006.01)

(52) U.S. Cl.
CPC .......... *B81B 3/0043* (2013.01); *B81B 3/0021* (2013.01); *G01L 9/0072* (2013.01);
(Continued)

(58) Field of Classification Search
CPC ................ B81B 3/0043; B81B 3/0021; B81B 2203/0127; B81B 2203/0154; B81B 2203/04; B81B 2201/0264; G01L 9/0072
See application file for complete search history.

(56) References Cited

U.S. PATENT DOCUMENTS 5,824,910 A    10/1998  Last et al.
9,134,189 B2*   9/2015  Hata ...................... G01L 1/144
(Continued)

FOREIGN PATENT DOCUMENTS

CN            201041027 Y      3/2008

OTHER PUBLICATIONS

International Search Report for PCT/EP2017/061822, dated Jul. 7, 2017.

*Primary Examiner* — Xin Y Zhong
(74) *Attorney, Agent, or Firm* — Norton Rose Fulbright US LLP; Gerard Messina

(57) ABSTRACT

A micromechanical component for a pressure sensor device, including a diaphragm that is stretched on a substrate and that is warpable via a pressure difference between a first side of the substrate and a second side of the substrate, and a rocker structure that is connected to the diaphragm in such a way that the rocker structure is movable about a first rotational axis via warping of the diaphragm. The rocker structure is connected to the diaphragm via a lever structure in such a way that the warping of the diaphragm triggers a rotational movement of the lever structure about a second rotational axis oriented in parallel to the first rotational axis and spaced apart from same, and the rotational movement of the lever structure about the second rotational axis triggers a further rotational movement of the rocker structure about the first rotational axis.

12 Claims, 8 Drawing Sheets

(52) U.S. Cl.
CPC ............. *B81B 2201/0264* (2013.01); *B81B 2203/0127* (2013.01); *B81B 2203/0154* (2013.01); *B81B 2203/04* (2013.01)

(56) References Cited

U.S. PATENT DOCUMENTS

| | | |
|---|---|---|
| 2013/0000411 A1 | 1/2013 | Robert et al. |
| 2014/0060169 A1 | 3/2014 | McNeil et al. |
| 2015/0268115 A1 | 9/2015 | Robert et al. |

\* cited by examiner

MICROMECHANICAL COMPONENT FOR A PRESSURE SENSOR DEVICE

FIELD

The present invention relates to a micromechanical component for a pressure sensor device, and a pressure sensor device. Moreover, the present invention relates to a method for manufacturing a micromechanical component for a pressure sensor device.

BACKGROUND INFORMATION

A pressure sensor that includes a rocker structure that is tiltable about a rotational axis is described in U.S. Patent Application Publication No. US 2014/0060169 A1. The rocker structure includes a first actuator electrode on a first side of the rotational axis, and a second actuator electrode on a second side of the rotational axis. In addition, the rocker structure is enclosed in an airtight housing, a diaphragm situated on the housing delimiting a reference pressure, present in the housing, from an external pressure/measuring pressure that is present in an outer volume of the housing. The housing also includes a first stator electrode associated with the first actuator electrode and a second stator electrode associated with the second actuator electrode.

SUMMARY

The present invention provides a micromechanical component for a pressure sensor device, a pressure sensor device, and a method for manufacturing a micromechanical component for a pressure sensor device.

The present invention provides micromechanical components/pressure sensor devices in which even a comparatively small warping of the diaphragm effectuates a relatively large deflection of the rocker structure (from its starting position, with pressure equilibrium between the first substrate side and the second substrate side). This relatively large deflection of the rocker structure (from its starting position) is reliably detectable with the aid of simple detection techniques (such as capacitive detection techniques), and may therefore be evaluated for determining sensor values (such as the pressure difference between the first substrate side and the second substrate side) in a relatively accurate and comparatively error-free manner. The present invention thus contributes to the improvement of sensor devices such as pressure sensor devices in particular.

The design of the lever element on the component/the pressure sensor device equipped with same according to the present invention allows not only the deflection of the rocker structure (from its starting position) to be intensified in proportion to the warping of the diaphragm, but also a relatively symmetrical design of the micromechanical component. This facilitates minimization of the micromechanical component/the pressure sensor device equipped with same according to the present invention. In addition, the symmetry of the particular micromechanical component/the pressure sensor device equipped with same has an advantageous effect on its insensitivity to an externally acting stress. The present invention thus provides micromechanical components for sensor devices, such as pressure sensor devices in particular, that are small and insensitive to stress.

Another advantage of the option for "mechanically intensifying" the deflection of the rocker structure as a response to the warping of the diaphragm via the lever element, provided with the aid of the present invention, is that the micromechanical components/pressure sensor devices according to the present invention may be equipped with a diaphragm that has a comparatively small surface area. Such small-surface area diaphragms are characterized by good linearity between the pressure difference between the first substrate side and the second substrate side, and the resulting warping of the diaphragm. Such small-surface area diaphragms also have a relatively low sensitivity to stress and a comparatively high robustness against overload.

In one advantageous specific embodiment of the micromechanical component in accordance with the present invention, the first rotational axis is situated in a plane that centrally and perpendicularly intersects the diaphragm. Alternatively, the first rotational axis may also be situated at least close to the diaphragm. An asymmetrical arrangement of the diaphragm with respect to a rocker midpoint is thus unnecessary, so that unutilized "dead spaces" within the rocker structure, which often occur in the related art, may be eliminated.

The lever structure is preferably connected to the diaphragm via a lifting element that contacts a surface of the diaphragm and is movable perpendicularly with respect to the diaphragm surface via the warping of the diaphragm. In addition, the lever structure may be connected to the rocker structure via at least one web element that is oriented in parallel to the first rotational axis. Comparatively simple elements for attaching the lever structure to the diaphragm and for attaching the lever structure to the rocker structure may thus be used.

A distance of the at least one web element from the second rotational axis is preferably greater than a distance of the first rotational axis from the second rotational axis. This allows an increase by a factor of at least 2 in the deflection of the rocker structure (from its starting position) in proportion to the warping of the diaphragm.

The lever structure is preferably suspended, via at least one first torsion spring, on at least one first column element that is anchored on the substrate, the rocker structure being suspended, via at least one second torsion spring, on the at least one first column element and/or at least one second column element that is anchored on the substrate. In particular, the lever structure may be suspended, via the at least one first torsion spring, on the at least one first column element, and the rocker structure may also be suspended, via the at least one second torsion spring, on the at least one first column element, in such a way that the single first torsion spring or at least one of the first torsion springs, and the single second torsion spring or at least one of the second torsion springs, are anchored on the same first column element.

The at least one first column element and/or the at least one second column element are/is preferably anchored on the substrate equidistantly from a midpoint of the diaphragm. This increases insensitivity to stress for this specific embodiment of the micromechanical component or the pressure sensor device equipped with same.

As advantageous refinements of the present invention, at least one first actuator electrode may be provided on the rocker structure on a first side of the first rotational axis, and at least one second actuator electrode may be provided on the rocker structure on a second side of the first rotational axis, in this case preferably at least one first stator electrode associated with the at least one first actuator electrode, and at least one second stator electrode associated with at least one second actuator electrode, being situated on and/or in the micromechanical component in such a way that a position of the stator electrodes is not influenced by the rotational movement of the lever structure about the second rotational axis, and is not influenced by the further rotational movement of the rocker structure about the first rotational axis. With the aid of a first capacitor formed from the at least one first actuator electrode and the at least one first stator electrode, and a second capacitor formed from the at least one second actuator electrode and the at least one second stator electrode, the instantaneous deflection of the rocker structure (from its starting position) may be easily and reliably detected/determined.

The single first stator electrode or at least one of the first stator electrodes is preferably situated on the substrate on a first side of the diaphragm, and the single second stator electrode or at least one of the second stator electrodes is situated on the substrate on a second side of the diaphragm. Due to the above-described option for situating the first rotational axis directly above the diaphragm or at least close to the diaphragm, a distance between the stator electrodes situated on the substrate may be selected to be comparatively small, thereby also reducing sensitivity of this specific embodiment of the micromechanical component to bending of the substrate caused by external stress.

As one advantageous refinement of the present invention, in addition to the stator electrodes situated on the substrate, at least one further first stator electrode and at least one further second stator electrode may also be situated on a side of the rocker structure directed away from the substrate. This may contribute to an increase in the capacitances of the capacitors implemented with the aid of the electrodes, with comparatively small electrode surface areas.

The advantages mentioned above are also achievable with a pressure sensor device that includes this type of micromechanical component.

In addition, carrying out a corresponding method for manufacturing a micromechanical component for a pressure sensor device also yields the described advantages. The manufacturing method may be refined according to the specific embodiments of the micromechanical component described above.

BRIEF DESCRIPTION OF THE DRAWINGS

Further features and advantages of the present invention are explained below with reference to the figures.

FIGS. 4a and 4b respectively show a schematic top view onto a fourth specific embodiment of the micromechanical component and a cross section of the fourth specific embodiment along an axis of symmetry/plane of symmetry in FIG. 4a.

FIGS. 5a and 5b respectively show a schematic top view onto a fifth specific embodiment of the micromechanical component and a cross section of the fifth specific embodiment along an axis of symmetry/plane of symmetry in FIG. 5a.

DETAILED DESCRIPTION OF EXAMPLE EMBODIMENTS

Figure 1:
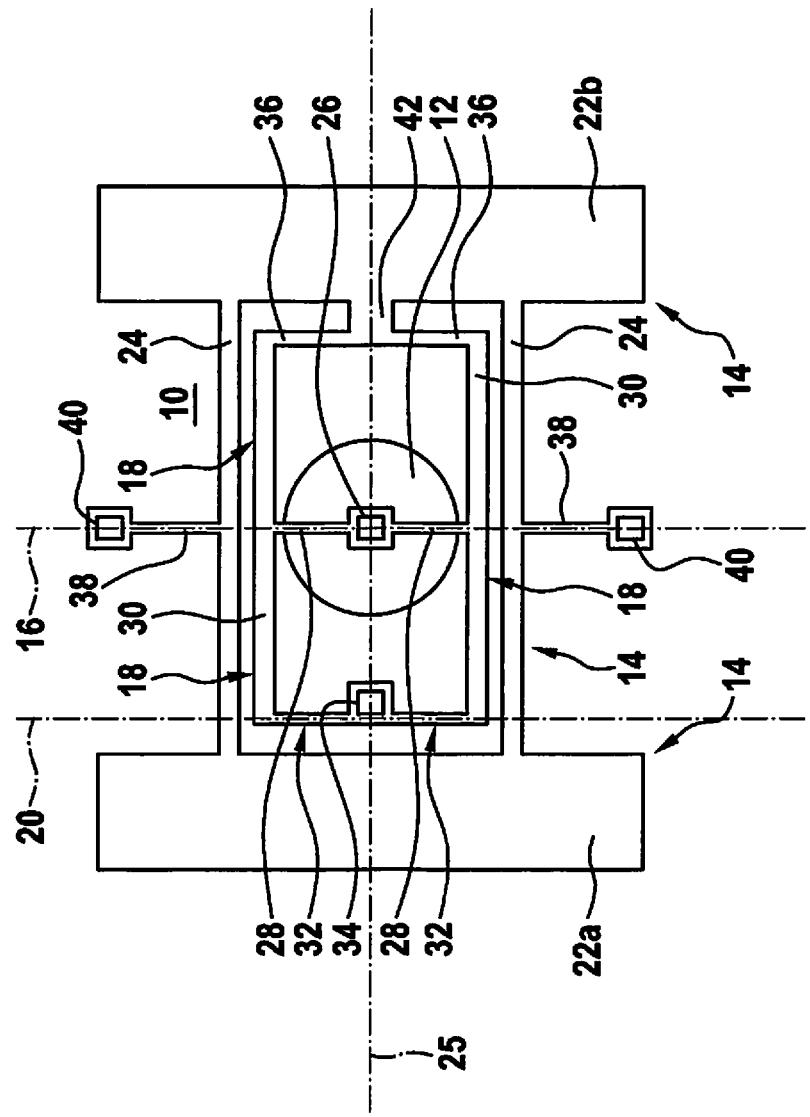
FIG. 1 shows a schematic top view onto a first specific embodiment of the micromechanical component.

FIG. 1 shows a schematic top view onto a first specific embodiment of the micromechanical component.

The micromechanical component schematically depicted in FIG. 1 includes a diaphragm 12 that is stretched on a substrate 10. Diaphragm 12 may, for example, cover an opening that is structured through substrate 10. Diaphragm 12 is warpable via a pressure difference (not equal to zero) between (a first pressure on) a first substrate side of substrate 10 and (a second pressure on) a second substrate side of substrate 10. When there is a pressure equilibrium between (the first pressure on) the first substrate side and (the second pressure on) the second substrate side, diaphragm 12 is present in its starting shape, whereas when there is a pressure difference (not equal to zero) between the first substrate side and the second substrate side, diaphragm 12 has a warping. The warping of diaphragm 12 may be understood to mean a concave curvature of diaphragm 12 into an inner volume of the micromechanical component and/or a convex curvature of diaphragm 12 out of the inner volume. Diaphragm 12 may therefore also be referred to as a pressure sensor diaphragm.

The micromechanical component also includes a rocker structure 14 that is connected to diaphragm 12 in such a way that rocker structure 14 is movable/moved about a first rotational axis 16 via warping of diaphragm 12. When the pressures are equal on the first substrate side and the second substrate side and diaphragm 12 is present in its starting shape, the rocker structure is in its starting position, whereas rocker structure 14 is movable out of its starting position, about first rotational axis 16, via the warping of diaphragm 12.

In addition, the micromechanical component includes a lever structure 18 via which rocker structure 14 is connected to diaphragm 12 in such a way that the warping of diaphragm 12 triggers a rotational movement of lever structure 18 about a second rotational axis 20, and the rotational movement of lever structure 18 about second rotational axis 20 triggers a (further) rotational movement of rocker structure 14 about first rotational axis 16. Second rotational axis 20 is oriented in parallel to first rotational axis 16 and spaced apart from first rotational axis 16.

The coupling of rocker structure 14 to diaphragm 12 via lever structure 18 increases a deflection of rocker structure 14, from its starting position, about second rotational axis 20 in proportion to the warping of diaphragm 12 from its starting shape. Lever element 18 is thus used not only to transfer the warping of diaphragm 12 to rocker structure 14, but also to intensify an effect of the warping of diaphragm 12 on rocker structure 14. The increased deflection (in proportion to the warping of diaphragm 12) of rocker structure 14 from its starting position may be determined/detected more easily and in a more error-free manner, as the result of which the warping of diaphragm 12 from its starting shape (or the pressure difference that may be present between the first substrate side and the second substrate side) is determinable/detectable more easily and in a more error-free manner. The micromechanical component may thus be used to implement a sensor device (such as an inertial sensor device and/or pressure sensor device) that is improved over the related art.

At least one first actuator electrode 22a is preferably situated on rocker structure 14 on a first side of first rotational axis 16, and at least one second actuator electrode 22b is preferably situated on rocker structure 14 on a second side of first rotational axis 16. The micromechanical component in FIG. 1 may also include at least one first stator electrode that is associated with the at least one first actuator electrode 22a, and at least one second stator electrode that is associated with the at least one second actuator electrode 22b. The stator electrodes are understood to mean electrodes that are situated on and/or in the micromechanical component in such a way that a position of the stator electrodes remains uninfluenced by the rotational movement of lever structure 18 about second rotational axis 20, and remains uninfluenced by the further rotational movement of rocker structure 14 about first rotational axis 16. The stator electrodes may thus also be referred to as electrodes that are fixedly/immovably situated on the micromechanical component. However, the stator electrodes are not depicted in FIG. 1 for the sake of better clarity.

As an example, rocker structure 14 of the micromechanical component in FIG. 1, in addition to (single) first actuator electrode 22a and (single) second actuator electrode 22b, also includes at least one connecting bar 24, in particular two connecting bars 24, via which actuator electrodes 22a and 22b are connected to one another. Rocker structure 14 made up of components 22a, 22b, and 24 surrounds lever structure 18. Rocker structure 14 made up of components 22a, 22b, and 24 preferably has a symmetrical design with respect to an axis of symmetry/plane of symmetry 25 that centrally intersects actuator electrodes 22a and 22b and/or that is oriented perpendicularly with respect to rotational axes 16 and 20. The two connecting bars 24 in this case extend between actuator electrodes 22a and 22b in parallel to axis of symmetry/plane of symmetry 25. Rocker structure 14 made up of components 22a, 22b, and 24 may also be symmetrical with respect to first rotational axis 16. However, it is pointed out that a design of rocker structure 14 is not limited to the example depicted here.

Lever structure 18 is preferably connected to diaphragm 12 via a lifting element 26 and 28 that contacts a surface of diaphragm 12 and that via the warping of diaphragm 12 is movable perpendicularly with respect to the diaphragm surface. As an example, in the specific embodiment in FIG. 1, lifting element 26 and 28 includes a column element 26 that is situated between two intermediate springs/intermediate webs 28, the two intermediate springs/intermediate webs 28 in each case extending along first rotational axis 16.

Lever structure 18 that is suspended/held with the aid of lifting element 26 and 28 may include two lever elements 30 that extend perpendicularly with respect to rotational axes 16 and 20. Lever structure 18 is suspended, via at least one first torsion spring 32, on at least one first column element 34 that is anchored on substrate 10. For example, the two lever elements 30 (at one of their ends in each case) may be suspended on (single) first column element 34 via a first torsion spring 32 in each case. On a side of first rotational axis 16 directed away from second rotational axis 20, the two lever elements 30 (at their other ends) may be connected to one another via a connecting web 36. Lever structure 18 made up of components 30, 32, and 36 may also be symmetrical with respect to axis of symmetry/plane of symmetry 25 that centrally intersects actuator electrodes 22a and 22b and/or that is oriented perpendicularly with respect to rotational axes 16 and 20. First rotational axis 16 may likewise extend centrally through lever structure 18 made up of components 30, 32, and 36.

Rocker structure 14 may also be suspended, via at least one second torsion spring 38, on the at least one first column element 36 and/or on at least one second column element 40 that is anchored on substrate 10. As an example, in the specific embodiment in FIG. 1, the two connecting bars 24 are each suspended on a second column element 40 via a second torsion spring 38 that in each case extends along first rotational axis 16 (away from lever structure 18).

In the specific embodiment in FIG. 1, on the side of first rotational axis 16 directed away from second rotational axis 20, actuator electrode 22b is connected to connecting web 36 of lever structure 18 via a connecting anchor 42. A distance between connecting anchor 42 and second rotational axis 20 is twice a distance between the two rotational axes 16 and 20. This allows twice the deflection of rocker structure 14 (from its starting position as a response to the warping of diaphragm 12) due to the use of lever structure 18.

With regard to further advantages of the micromechanical component in FIG. 1, reference is made to the description below.

Figure 2:
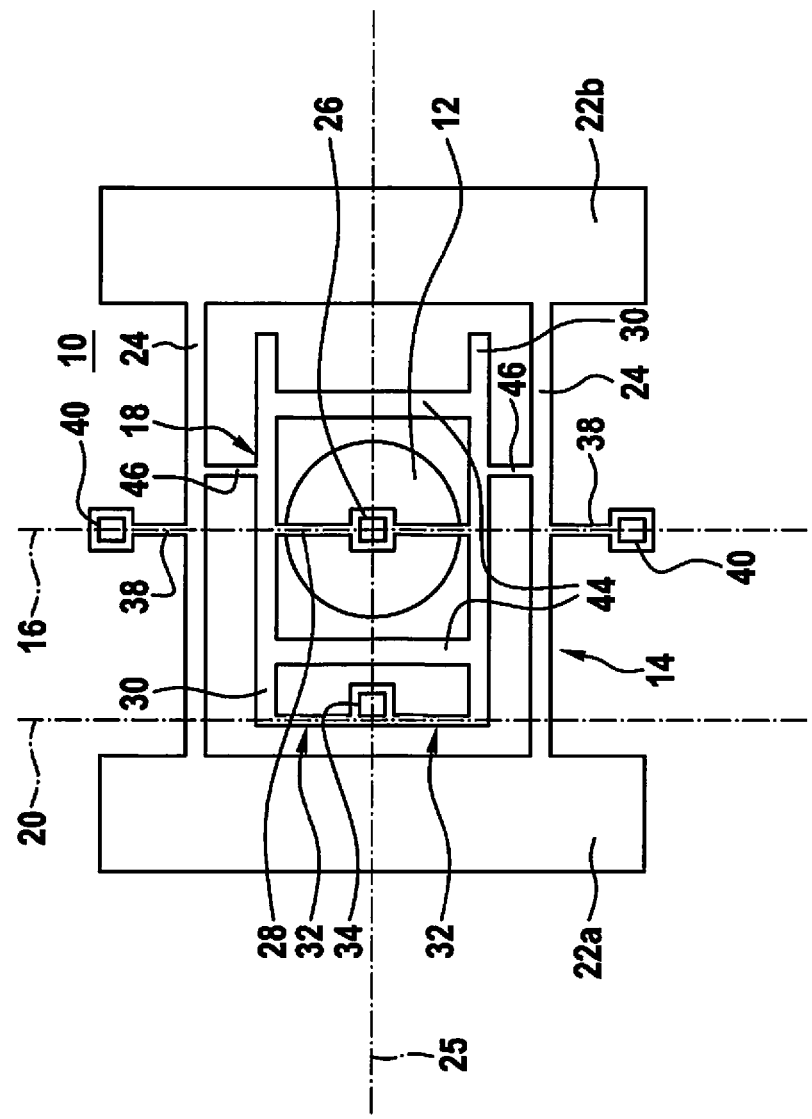
FIG. 2 shows a schematic top view onto a second specific embodiment of the micromechanical component.

FIG. 2 shows a schematic top view onto a second specific embodiment of the micromechanical component.

In the specific embodiment in FIG. 2, lever elements 30 are connected to one another via two connecting webs 44, thus achieving higher mechanical robustness of lever structure 18. However, lever structure 18 may still be symmetrical with respect to axis of symmetry/plane of symmetry 25 that centrally intersects actuator electrodes 22a and 22b and/or that is oriented perpendicularly with respect to rotational axes 16 and 20. First rotational axis 16 may likewise extend centrally through lever structure 18.

In addition, lever structure 18 is connected to rocker structure 14 via at least one web element 46 that is oriented in parallel to first rotational axis 16, a distance of the at least one web element 46 from second rotational axis 20 being greater than the distance of first rotational axis 16 from second rotational axis 20. This results in an increase by more than a factor of 2 in the deflection of rocker structure 14 (from its starting position as a response to the warping of diaphragm 12) due to the use of lever structure 18. The intensification factor by which the deflection of rocker structure 14 (from its starting position as a response to the warping of diaphragm 12) is increased may be determined by the distance of the at least one web element 46 from second rotational axis 20. Thus, for example, sensor devices (such as inertial sensor devices and/or pressure sensor devices in particular) having different measuring ranges but having the same basic configuration, size, and basic structure of their evaluation circuit may be specified for their desired measuring range by determining the distance of the at least one web element 46 from second rotational axis 20. In addition, virtually the same manufacturing method may be carried out for manufacturing these sensor devices having different measuring ranges. As an example, in the specific embodiment in FIG. 2 the two lever elements 30 are connected to adjacent connecting bar 24 of rocker structure 14 via a web element 46 in each case.

With regard to further features of the micromechanical component in FIG. 2 and its advantages, reference is made to the specific embodiment explained above, and to the following description.

Figure 3:
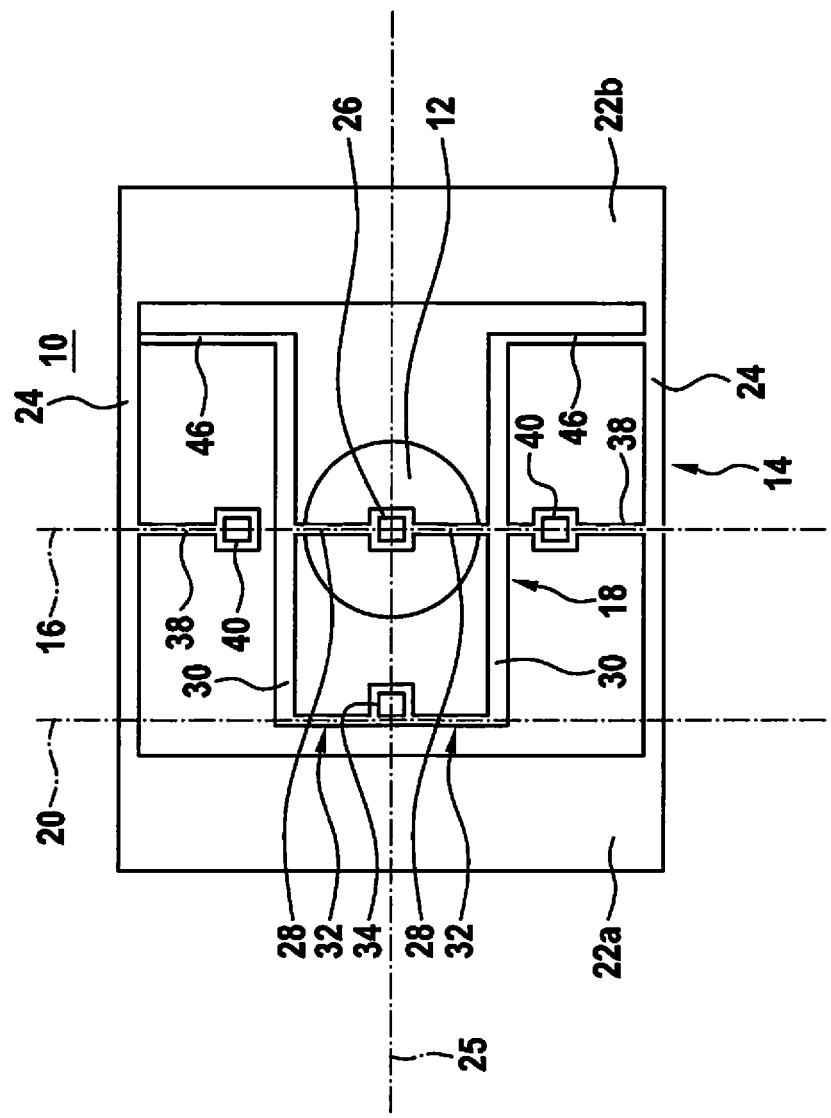
FIG. 3 shows a schematic top view onto a third specific embodiment of the micromechanical component.

FIG. 3 shows a schematic top view onto a third specific embodiment of the micromechanical component.

As is apparent with reference to FIG. 3, a design of lever structure 18 with connecting webs 44 may also be dispensed with.

In addition, the two connecting bars 24 of rocker structure 14 may be suspended in each case on a second column element 40 via a second torsion spring 38 that extends in each case along first rotational axis 16 in the direction toward lever structure 18. In this case, rocker structure 14 surrounds lever structure 18, web elements 46, and all column elements 34 and 40. All column elements 34 and 40 may be anchored on substrate 10, equidistantly from a midpoint of diaphragm 12, with the aid of such an arrangement of column elements 34 and 40. Bending of substrate 10 due to a force that is externally exerted on the substrate or a change in temperature thus has effects on column elements 34 and 40 and structures 14 and 18 suspended thereon, which "average one another out". The specific embodiment in FIG. 3 therefore has relatively low sensitivity to the force externally exerted on substrate 10 or to a change in temperature.

With regard to further features and advantages of the micromechanical component in FIG. 3, reference is made to the following description.

Figure 4A:
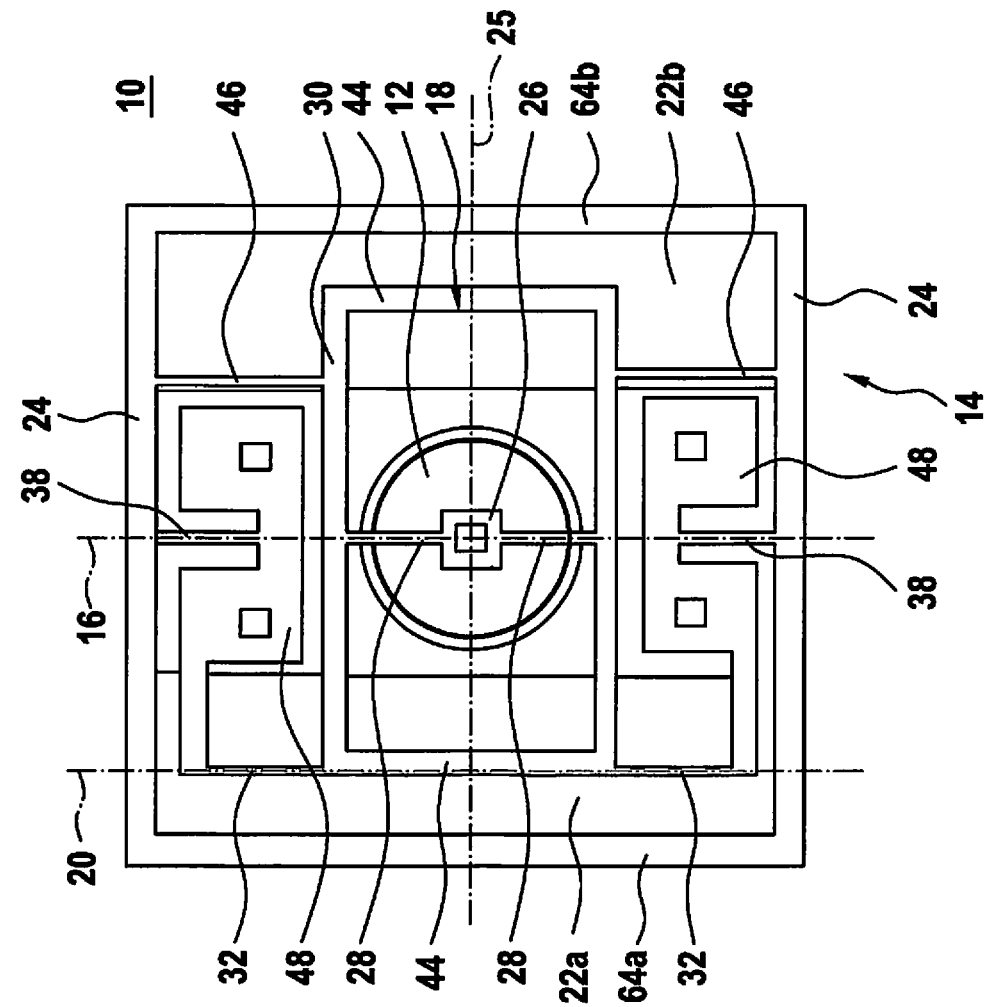
Figure 4B:
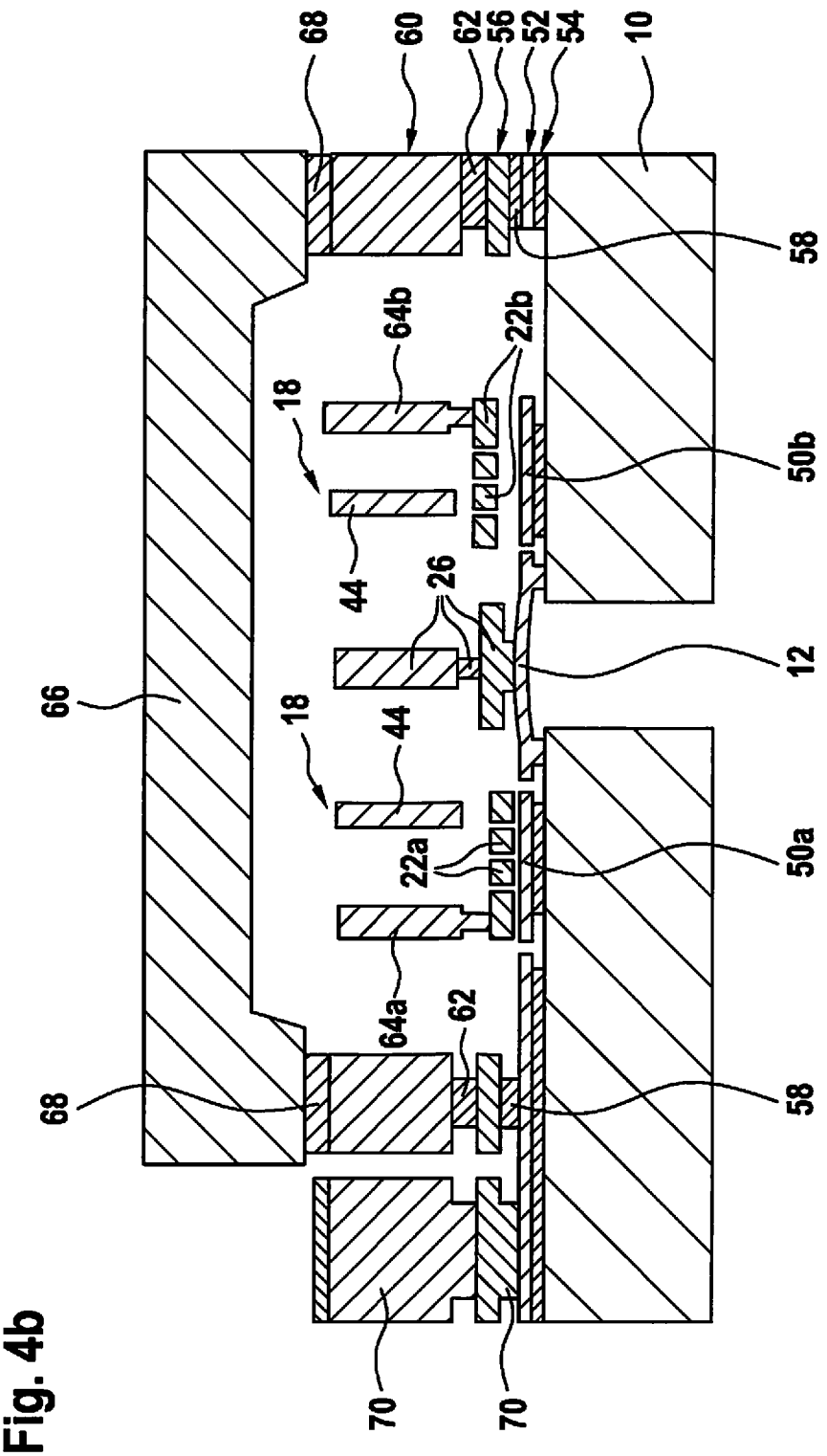

FIGS. 4a and 4b respectively show a schematic top view onto a fourth specific embodiment of the micromechanical component, and a cross section of the fourth specific embodiment along an axis of symmetry/plane of symmetry in FIG. 4a.

In the specific embodiment in FIGS. 4a and 4b, the two lever elements 30 (at each of their ends) are suspended on a column element 48 in each case via a first torsion spring 32 that extends in each case along second rotational axis 20 in the direction toward rocker structure 14. The two connecting bars 24 of rocker structure 14 are likewise suspended on the adjacent column element 48 in each case via a second torsion spring 38 that extends in each case along first rotational axis 16 in the direction toward lever structure 18. In addition, each of the two column elements 48 includes two anchoring areas on substrate 10, the total of four anchoring areas being situated on substrate 10 equidistantly from the midpoint of diaphragm 12.

Thus, the specific embodiment in FIGS. 4a and 4b also has relatively low sensitivity to a force that is externally exerted on substrate 10 or to a change in temperature.

FIG. 4b shows a cross section of the micromechanical component in FIGS. 4a and 4b along axis of symmetry/plane of symmetry 25. It is apparent that (at least) diaphragm 12, at least one first stator electrode 50a that is associated with the at least one first actuator electrode 22a, and at least one second stator electrode 50b that is associated with the at least one second actuator electrode 22b are structured out of a first semiconductor layer and/or metal layer 52, which is deposited on a first insulating layer 54 that partially covers substrate 10. The at least one first stator electrode 50a is situated on substrate 10 on a first side of diaphragm 12. Similarly, the at least one second stator electrode 50b is situated on substrate 10 on a second side of diaphragm 12. Alternatively, "exposed" stator electrodes may also be situated on a side of rocker structure 14 that is oriented toward substrate 10, as the result of which sensitivity of the micromechanical component in FIGS. 4a and 4b to a force that is externally exerted on substrate 10 is additionally reducible.

A structured second semiconductor layer and/or metal layer 56 is formed on a side of first semiconductor layer and/or metal layer 52 directed away from substrate 10; residues of a second insulating layer 58 may be present between subareas of structured second semiconductor layer and/or metal layer 56 and structured first semiconductor layer and/or metal layer 52, while other subareas of structured second semiconductor layer and/or metal layer 56 may directly contact structured first semiconductor layer and/or metal layer 52. In addition, a structured third semiconductor layer and/or metal layer 60 is present on a side of second semiconductor layer and/or metal layer 56 directed away from substrate 10; subareas of structured third semiconductor layer and/or metal layer 60 directly contact structured second semiconductor layer and/or metal layer 56, while other subareas of structured third semiconductor layer and/or metal layer 60 are separate/insulated from structured second semiconductor layer and/or metal layer 56 with the aid of residues of a third insulating layer 62.

Lever structure 18 (with connecting webs 44 shown), web elements 46, and torsion springs 32 and 38 are preferably structured out of third semiconductor layer and/or metal layer 60. Electrode suspension structures 64a and 64b, via which actuator electrodes 22a and 22b of rocker structure 14 are held apart from diaphragm 10, are also structured out of third semiconductor layer and/or metal layer 60. In addition, the micromechanical component in FIGS. 4a and 4b includes a cap 66 that spans structures 14 and 18 and stator electrodes 50a and 50b, and that is fastened to residues of structured third semiconductor layer and/or metal layer 60 with the aid of at least one bond connection 68. As a further optional component, at least one contact 70 made up of subareas of semiconductor layer and/or metal layers 52, 56, and 60 may be put together externally from cap 66.

Further features and advantages of the specific embodiment in FIGS. 4a and 4b are described in greater detail below.

Figure 5A:
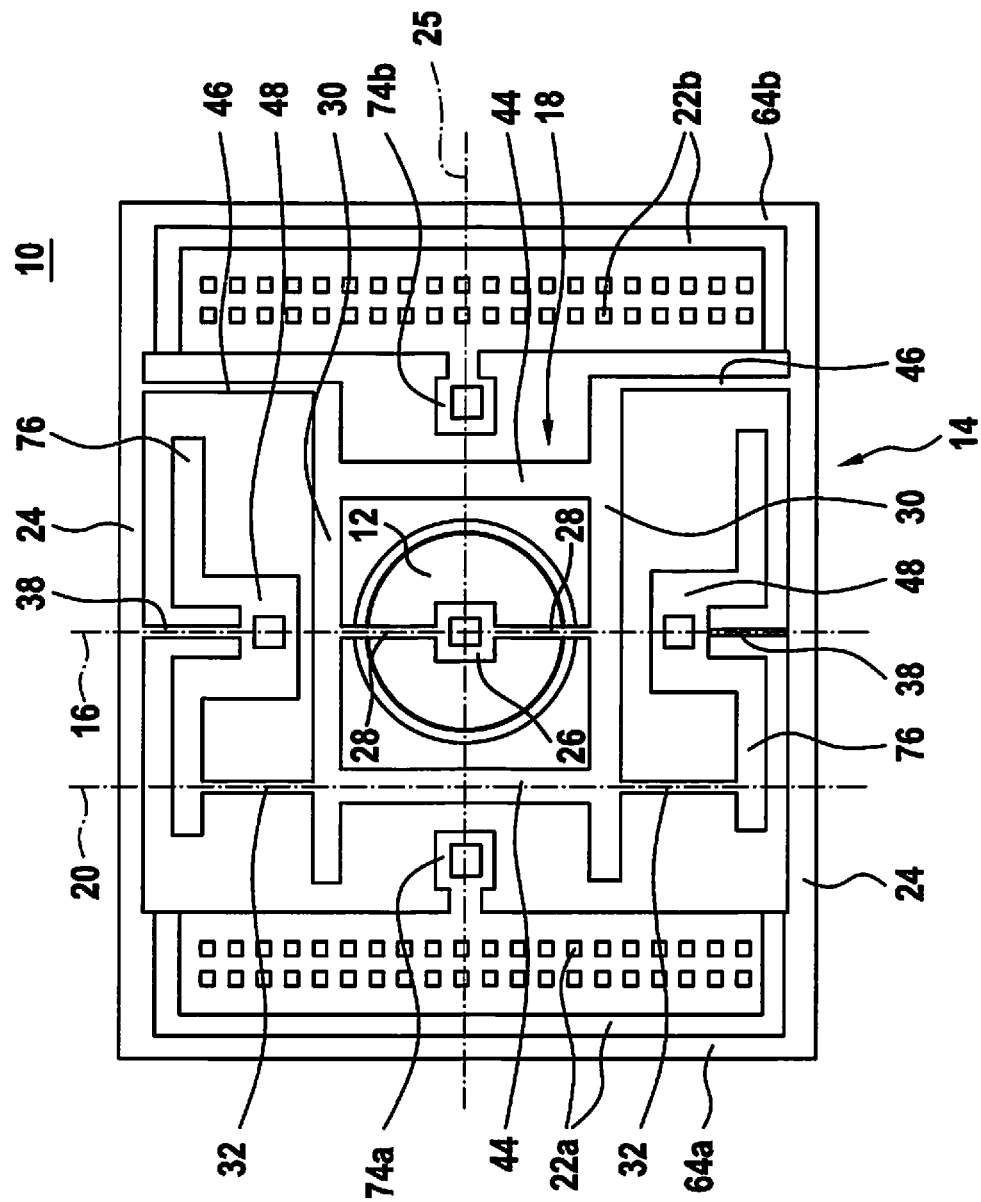
Figure 5B:
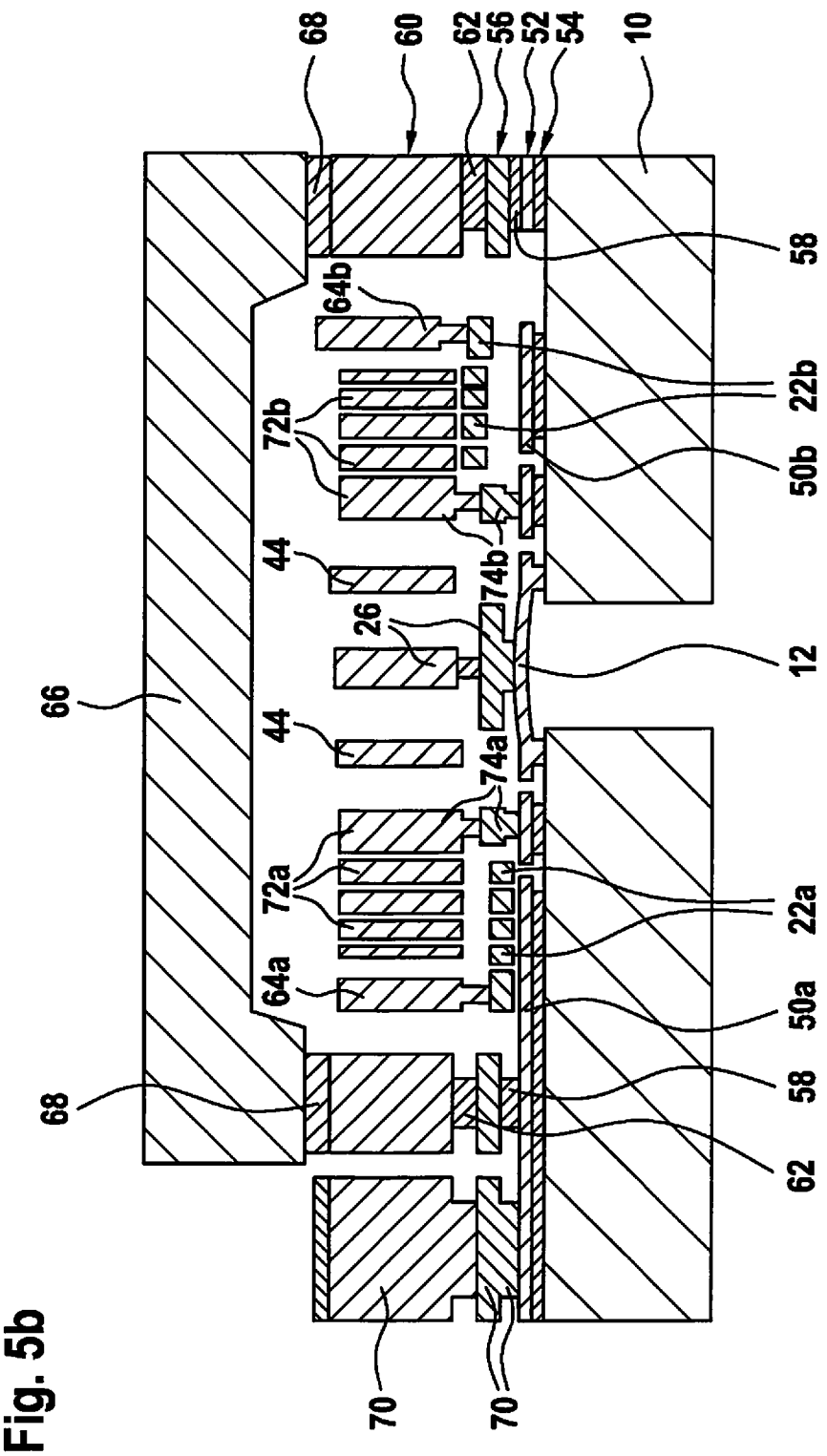

FIGS. 5a and 5b respectively show a schematic top view onto a fifth specific embodiment of the micromechanical component, and a cross section of the fifth specific embodiment along an axis of symmetry/plane of symmetry in FIG. 5a.

As a refinement of the specific embodiment described above, for the micromechanical component in FIGS. 5a and 5b, (in addition to stator electrodes 50a and 50b situated on substrate 10), at least one further first stator electrode 72a and at least one further second stator electrode 72b are also situated on a side of rocker structure 14 directed away from substrate 10. The at least one further first stator electrode 72a and the at least one further second stator electrode 72b are also structured out of third semiconductor layer and/or metal layer 60. (This is apparent in FIG. 5b, which shows a cross section along axis of symmetry/plane of symmetry 25 in FIG. 5a.)

Support elements 74a and 74b of further stator electrodes 72a and 72b, which are made up of subareas of semiconductor layer and/or metal layers 52, 56, and 60, ensure a reliable hold of further stator electrodes 72a and 72b in positions on substrate 10 that are not impaired by movements of structures 14 and 18.

With the aid of further stator electrodes 72a and 72b, capacitors having comparatively high capacitances may be produced from electrodes 22a, 22b, 50a, 50b, 72a and 72b, even for a comparatively small volume of the micromechanical component in FIGS. 5a and 5b. It is likewise also possible to apply a rocker potential to stator electrodes 50a and 50b in order to achieve less sensitivity of the micromechanical component in FIGS. 5a and 5b to stress from a force that is externally exerted on substrate 10.

In addition, auxiliary elements 76 on which first torsion springs 32 are anchored are formed on column elements 48. Adjustability of lever structure 18 from its starting position may be additionally increased with the aid of auxiliary elements 76. In addition, for the micromechanical component in FIGS. 5a and 5b, column elements 48 and support elements 74a and 74b of further stator electrodes 72a and 72b are anchored on substrate 10 equidistantly from a midpoint of diaphragm 12. This increases insensitivity of this specific embodiment to stress from an externally exerted force on substrate 10 or to a change in temperature.

Further properties of the micromechanical component in FIGS. 5a and 5b are now explained in conjunction with the specific embodiments described above.

All micromechanical components described above are well suited for use as (at least part of) a sensor device (such as an inertial sensor device and/or pressure sensor device). The coupling of diaphragm 12 to rocker structure 14 via lever structure 18 improves the intensity of the deflection of rocker structure 14 (from its starting position) in proportion to the warping of diaphragm 12, and thus increases sensitivity of the particular sensor device for all micromechanical components described above. The micromechanical components may also be satisfactorily manufactured and used as a module together with some other type of sensor, such as an acceleration sensor and/or a rotation rate sensor.

In all micromechanical components described above, first rotational axis 16 is situated in a plane that centrally and perpendicularly intersects diaphragm 12. Diaphragm 12 is preferably situated symmetrically within rocker structure 14 and centrally within lever structure 18. This arrangement of diaphragm 12 within rocker structure 14 additionally improves the intensity of the deflection of rocker structure 14 (from its starting position) with respect to the warping of diaphragm 12.

At the same time, diaphragm 12 may be designed with a comparatively small surface area without adversely affecting the capability for rocker structure 14 to undergo comparatively large deflections from its starting position. The design of diaphragm 12 with a comparatively small surface area requires relatively little surface area/volume, and compared to diaphragms having a larger surface area has less sensitivity to stress. In addition, diaphragms having a small surface area show (virtually) linear behavior of their diaphragm bending as a response to a pressure difference between the first substrate side and the second substrate side. Diaphragms having a small surface area also have a less sensitive response to excessive stress than diaphragms having a large surface area. Furthermore, a substrate 10 that includes diaphragm 12 designed with a comparatively small surface area is more resistant to a force exerted thereon than a comparative substrate having the same substrate dimensions, but with a diaphragm having a large surface area.

All micromechanical components described above may have an airtight inner volume, their diaphragm 12 delimiting a reference pressure, present in the inner volume, with respect to an external pressure/measuring pressure. In particular, a negative pressure or a (virtual) vacuum may be present in the inner volume.

Figure 6:
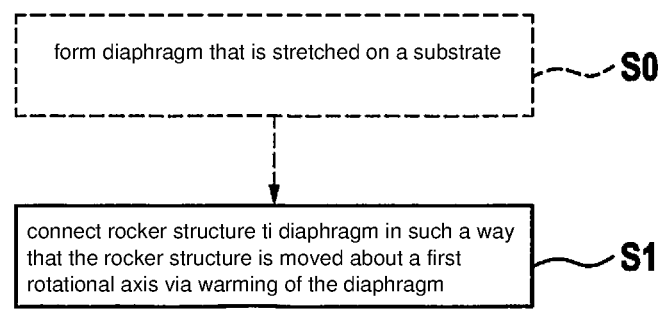
FIG. 6 shows a flow chart for explaining one specific embodiment of the method for manufacturing a micromechanical component for a pressure sensor device.

FIG. 6 shows a flow chart for explaining one specific embodiment of the method for manufacturing a micromechanical component for a pressure sensor device.

A diaphragm that is stretched on a substrate, and that is warpable/warped between a first side of the substrate and a second side of the substrate via a pressure difference, is initially formed in an optional method step S0. However, as an alternative to method step S0, a "finished" substrate that includes such a diaphragm may also be used for carrying out the manufacturing method described here.

In a method step S1, a rocker structure is connected to the diaphragm in such a way that the rocker structure is moved about a first rotational axis via warping of the diaphragm. The rocker structure is connected to the diaphragm via a lever structure. This takes place in such a way that due to the warping of the diaphragm, the lever structure is set into a rotational movement about a second rotational axis that is oriented in parallel to the first rotational axis and spaced apart from the first rotational axis, and due to the rotational movement of the lever structure about the second rotational axis, the rocker structure is set into a further rotational movement about the first rotational axis. As method step S1, the rocker structure, the lever structure, and possibly at least one further component of the subsequent micromechanical component may be structured out of at least one semiconductor layer and/or metal layer with the aid of at least one etching process. For example, the specific embodiments of the micromechanical component described above may be manufactured in this way. However, practicability of the manufacturing method described here is not limited to the manufacture of the specific embodiments described above.

What is claimed is:

1. A micromechanical component for a pressure sensor device, comprising:
   a diaphragm that is stretched on a substrate and that is warpable via a pressure difference between a first side of the substrate and a second side of the substrate;
   a rocker structure that is connected to the diaphragm in such a way that the rocker structure is movable about a first rotational axis via warping of the diaphragm; and
   a lever structure via which the rocker structure is connected to the diaphragm in such a way that the warping of the diaphragm triggers a rotational movement of the lever structure about a second rotational axis oriented in parallel to the first rotational axis and spaced apart from the first rotational axis, and the rotational movement of the lever structure about the second rotational axis triggers a further rotational movement of the rocker structure about the first rotational axis.

2. The micromechanical component as recited in claim 1, wherein the first rotational axis is situated in a plane that centrally and perpendicularly intersects the diaphragm.

3. The micromechanical component as recited in claim 1, wherein the lever structure is connected to the diaphragm via a lifting element that contacts a surface of the diaphragm and is movable perpendicularly with respect to the surface via the warping of the diaphragm.

4. The micromechanical component as recited in claim 1, wherein the lever structure is connected to the rocker structure via at least one web element that is oriented in parallel to the first rotational axis, and a distance of the at least one web element from the second rotational axis is greater than a distance of the first rotational axis from the second rotational axis.

5. The micromechanical component as recited in claim 1, wherein the lever structure is suspended, via at least one first torsion spring, on at least one first column element that is anchored on the substrate, and the rocker structure is suspended, via at least one second torsion spring, on the at least one first column element and/or at least one second column element that is anchored on the substrate.

6. The micromechanical component as recited in claim 5, wherein the lever structure is suspended, via the at least one first torsion spring, on the at least one first column element, and the rocker structure is also suspended, via the at least one second torsion spring, on the at least one first column element, in such a way that a single first torsion spring or at least one of the first torsion springs, and a single second torsion spring or at least one of the second torsion springs, are anchored on the same first column element.

7. The micromechanical component as recited in claim 5, wherein the at least one first column element and/or the at least one second column element is anchored on the substrate equidistantly from a midpoint of the diaphragm.

8. The micromechanical component as recited in claim 1, wherein at least one first actuator electrode is provided on the rocker structure on a first side of the first rotational axis, and at least one second actuator electrode is provided on the rocker structure on a second side of the first rotational axis, and at least one first stator electrode associated with one of the at least one first actuator electrode, and at least one second stator electrode associated with one of the at least one second actuator electrode, are situated on and/or in the micromechanical component in such a way that a position of the at least one first stator electrode and the at least one second stator electrode is not influenced by the rotational movement of the lever structure about the second rotational axis, and is not influenced by the further rotational movement of the rocker structure about the first rotational axis.

9. The micromechanical component as recited in claim 8, wherein a single first stator electrode or at least one of the first stator electrodes is situated on the substrate on a first side of the diaphragm, and a single second stator electrode or at least one of the second stator electrodes is situated on the substrate on a second side of the diaphragm.

10. The micromechanical component as recited in claim 9, wherein at least one further first stator electrode and at least one further second stator electrode are also situated on a side of the rocker structure directed away from the substrate.

11. A pressure sensor device, comprising:
   a micromechanical component, including:
      a diaphragm that is stretched on a substrate and that is warpable via a pressure difference between a first side of the substrate and a second side of the substrate,
      a rocker structure that is connected to the diaphragm in such a way that the rocker structure is movable about a first rotational axis via warping of the diaphragm, and
      a lever structure via which the rocker structure is connected to the diaphragm in such a way that the warping of the diaphragm triggers a rotational movement of the lever structure about a second rotational axis oriented in parallel to the first rotational axis and spaced apart from the first rotational axis, and the rotational movement of the lever structure about the second rotational axis triggers a further rotational movement of the rocker structure about the first rotational axis.

12. A method for manufacturing a micromechanical component for a pressure sensor device, comprising:
   connecting a rocker structure to a diaphragm that is stretched on a substrate and that is warpable via a pressure difference between a first side of the substrate and a second side of the substrate, in such a way that the rocker structure is moved about a first rotational axis via warping of the diaphragm;
   wherein the rocker structure is connected to the diaphragm via a lever structure in such a way that due to the warping of the diaphragm, the lever structure is set into a rotational movement about a second rotational axis that is oriented in parallel to the first rotational axis and spaced apart from the first rotational axis, and due to the rotational movement of the lever structure about the second rotational axis, the rocker structure is set into a further rotational movement about the first rotational axis.

* * * * *